United States Patent
Alini et al.

[11] Patent Number: 5,963,065
[45] Date of Patent: Oct. 5, 1999

[54] LOW OFFSET PUSH-PULL AMPLIFIER

[75] Inventors: Roberto Alini, Pavia; Melchiorre Bruccoleri, Genova; Gaetano Cosentino, Catania; Valerio Pisati, Pavia, all of Italy

[73] Assignees: SGS-Thomson Microelectronics S.r.L., Agrate Brianza; Consorzio per la Ricerca sulla Microelettronica nel Mezzogiorno, Catania, both of Italy

[21] Appl. No.: 08/787,301

[22] Filed: Jan. 24, 1997

[51] Int. Cl.$^6$ .................................................. H03F 3/26
[52] U.S. Cl. ........................ 327/112; 327/264; 327/307; 327/489; 330/263; 330/268
[58] Field of Search ...................... 330/262, 263, 330/264, 266, 267, 268; 327/112, 307, 437, 484, 485, 492, 387, 489

[56] References Cited

U.S. PATENT DOCUMENTS

| | | | |
|---|---|---|---|
| 4,893,091 | 1/1990 | Lillis et al. | 330/268 |
| 5,057,790 | 10/1991 | Landi | 330/268 |
| 5,546,048 | 8/1996 | Sano et al. | 330/263 |

FOREIGN PATENT DOCUMENTS

| | | | |
|---|---|---|---|
| 0 073 353 | 3/1983 | European Pat. Off. | H03F 3/30 |
| 26 46 386 | 4/1978 | Germany | 330/263 |
| 55-115706 | 9/1980 | Japan | 330/264 |
| 1506512 | 9/1989 | U.S.S.R. | 330/263 |
| 2 263 597 | 7/1993 | United Kingdom | H03F 3/343 |

OTHER PUBLICATIONS

Patent Abstracts of Japan, vol. 001, No. 088 (E–036), Aug. 16, 1977 & JP–A–52 023246 (Sony Corp.).

*Primary Examiner*—Timothy P. Callahan
*Assistant Examiner*—Terry L. Englund
*Attorney, Agent, or Firm*—Wolf, Greenfield & Sacks, P.C.

[57] ABSTRACT

A low offset amplifier has an output stage constituted by an npn transistor and a pnp transistor in a push-pull arrangement, and a driver stage. The latter includes a current-mirror circuit having, in its input branch, a pnp transistor in series with a first constant-current generator and, in its output branch, an npn transistor, and two complementary bipolar transistors with collectors connected together to the output terminal and the bases are connected together to the input terminal of the amplifier. The emitter of the pnp transistor of the driver stage is connected to the positive terminal of the supply by a second constant-current generator and to the base of the npn transistor of the output stage, and the emitter of the npn transistor of the driver stage is connected to the negative terminal of the supply by the npn transistor of the output branch of the current-mirror circuit and to the base of the pnp transistor of the output stage. The amplifier has a very low or zero offset (Vos= Vout–Vin).

20 Claims, 3 Drawing Sheets

LOW OFFSET PUSH-PULL AMPLIFIER

BACKGROUND OF THE INVENTION

1. Field of the Invention

The present invention relates to an amplifier having a driver stage and an output stage connected in cascade.

2. Discussion of the Related Art

"Buffer" or separation amplifiers, that is, amplifiers in which the input circuit is fairly insensitive to variations in the load impedance, are used in many circuit systems. A buffer amplifier is consequently used when a signal generated by a circuit with high output impedance has to control a load with low impedance, such as a capacitor with a large capacitance, if the control signal is of high frequency, or a resistor with low resistance.

A simple known buffer amplifier is shown in FIG. 1 of the appended drawings. It is constituted by two complementary bipolar transistors one of npn type, indicated Q1, and one of pnp type, indicated Q2, connected in a push-pull arrangement between the two poles, that is, the positive pole, indicated vdd, and the negative pole, indicated gnd, of a voltage supply. The bases of the two transistors are joined together to form the input terminal IN of the amplifier and the connection point between the two emitters is the output terminal OUT of the amplifier. A circuit with a high output impedance connected to the input IN of the amplifier is represented by a high-frequency alternating-voltage generator vi and by a resistor Ri in series, and a low impedance load is represented by a capacitor C.

In operation, the two transistors behave alternately like an amplifier with a common collector (an emitter follower) during the positive half-wave and during the negative half-wave of the input signal, respectively, so that the circuit has all of the characteristics of an amplifier of this type, amongst which is a low output impedance.

The known circuit described above has an "offset", that is, a deviation between the output voltage level and the input voltage level, which is substantially equal to the voltage drop at the forward biased base-emitter junction of the npn transistor or of the pnp transistor. The offset causes a distortion of the signal, known as "cross-over distortion" in the case of sinusoidal input signals, which is more notable the smaller the input signal. Moreover, the voltage drop at the forward biased base-emitter junction varies from one specimen of the same integrated circuit in which the "buffer" is formed to another, because of the inevitable variations in the processing parameters, and also varies with the operating temperature.

There are applications in which the supply voltage is low, so that the signals to be processed are also of low level, or in which the variability of the offset creates serious problems in the design of the circuits downstream of the amplifier.

An object of the present invention is therefore to propose an amplifier of the type having a driver stage and an output stage connected in cascade which has a very low or even zero offset.

SUMMARY OF THE INVENTION

This and other objects are achieved, according to the invention, by an amplifier comprising a driver stage and an output stage connected in cascade between an input terminal and an output terminal of the amplifier, the output stage comprising a first NPN transistor and a second PNP transistor, connected in a push-pull arrangement with one another, with their emitters connected together to the output terminal of the amplifier and with their collectors connected, respectively, to a first supply terminal and to a second supply terminal of the amplifier, which are intended to be connected, respectively, to the positive and negative poles of a supply, and the driver stage having two output terminals connected, respectively, to the base of the first transistor and to the base of the second transistor. The driver stage comprises a current-mirror circuit having an input branch comprising a third transistor connected in series with a first constant-current generator between the first and second supply terminals and an output branch comprising a fourth transistor, as well as a fifth PNP transistor and a sixth NPN transistor of which the collectors are connected together to the output terminal of the amplifier and the bases are connected together to the input terminal of the amplifier, and of which one has its emitter connected to the first supply terminal by means of a second constant-current generator and the other has its emitter connected to the second supply terminal by means of the output branch of the current-mirror circuit, the emitters also being connected, respectively, to the base of the first transistor and to the base of the second transistor.

BRIEF DESCRIPTION OF THE DRAWINGS

The invention will be better understood from the following detailed description of a preferred embodiment thereof given with reference to the appended drawings, in which.

DETAILED DESCRIPTION

Figure 1:
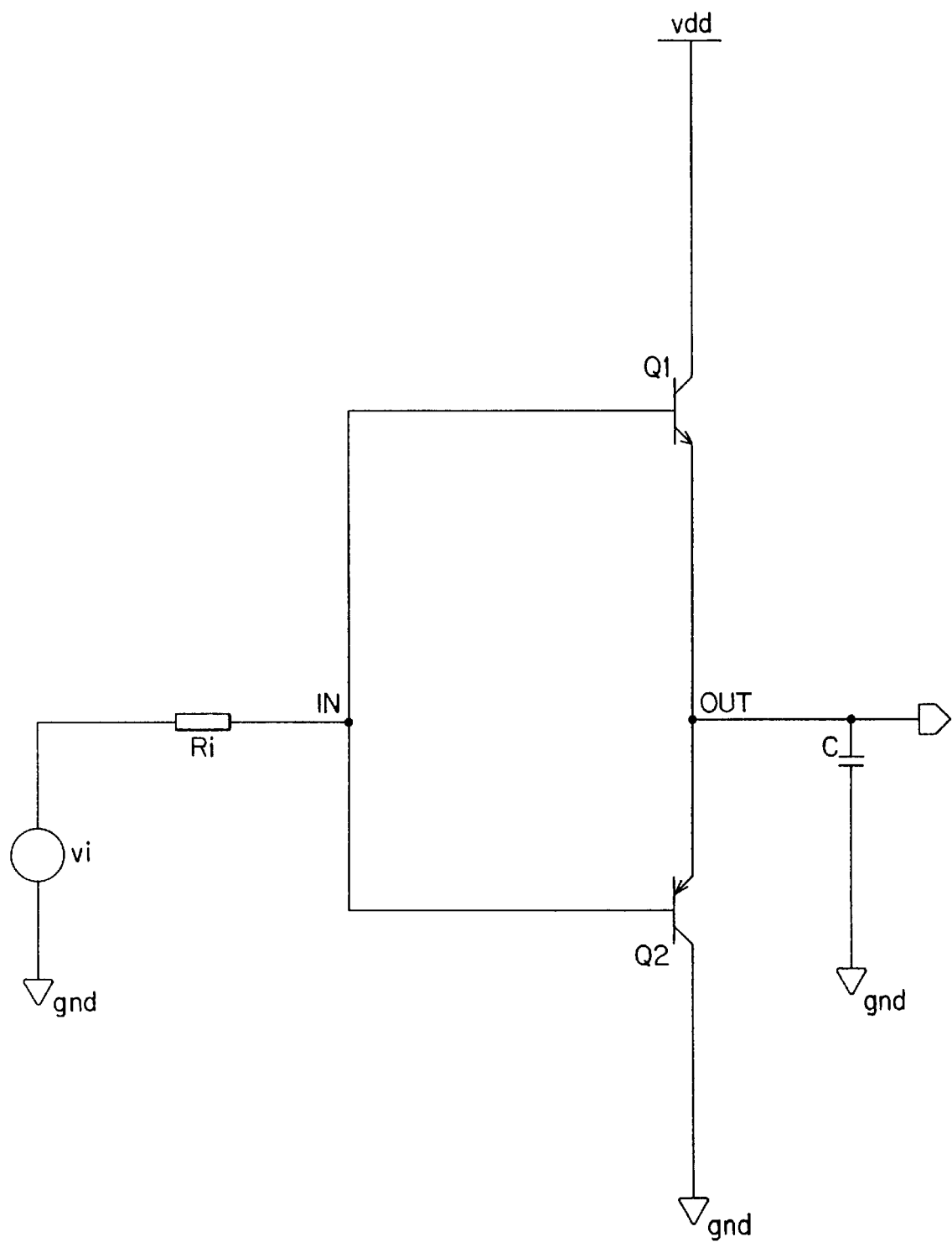
FIG. 1 is the circuit diagram of a known amplifier.
Figure 2:
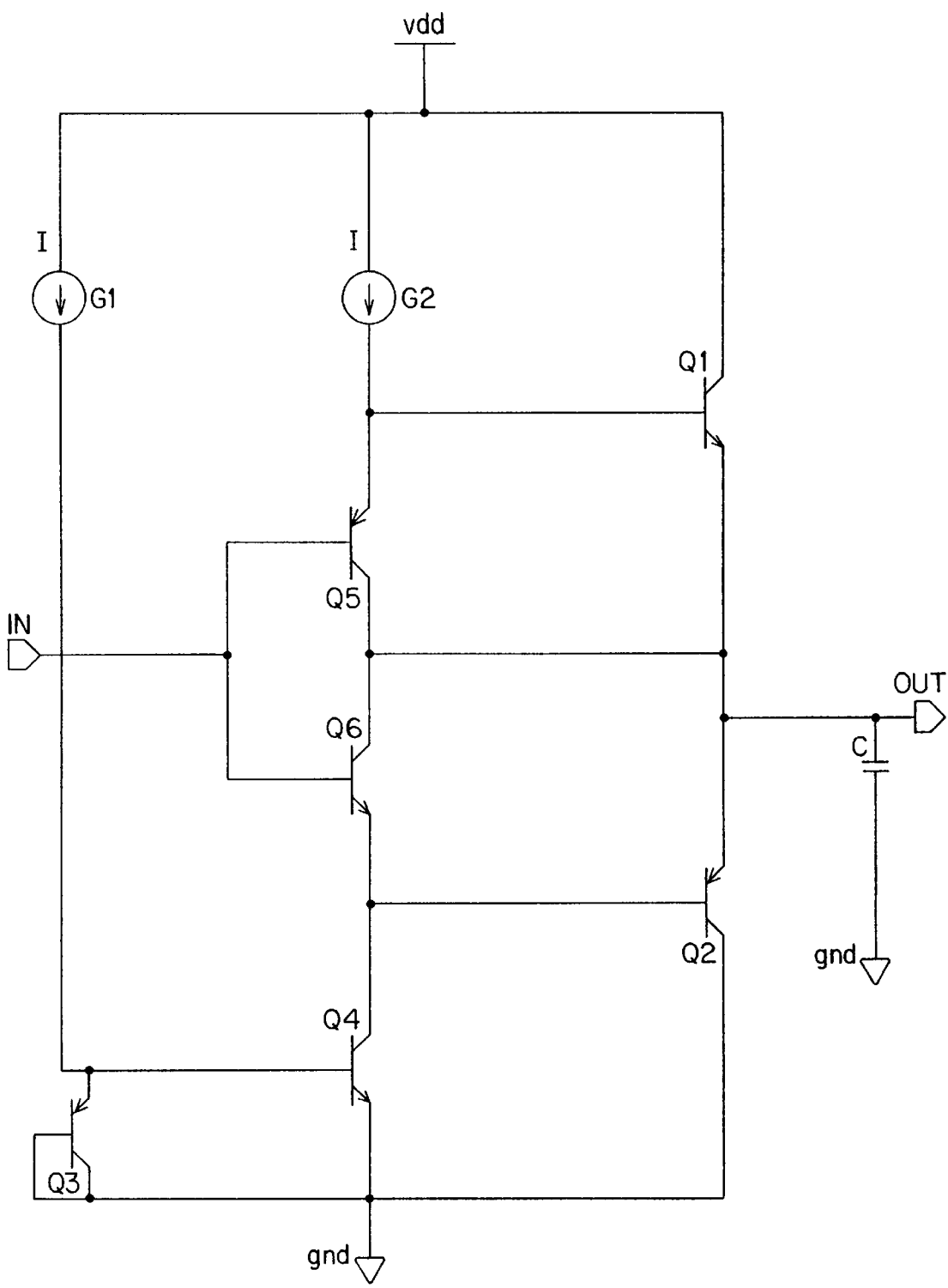
FIG. 2 is the circuit diagram of an amplifier according to the invention.

The amplifier of FIG. 2 has a driver stage and an output stage connected in cascade with one another between the input terminal IN and the output terminal OUT of the amplifier. The output stage is constituted by two complementary bipolar transistors Q1 and Q2 connected in a push-pull arrangement, as in the known amplifier of FIG. 1, and the driver stage comprises a pnp transistor Q5 and an npn transistor Q6 of which the collectors are connected together to the emitters of the transistors Q1 and Q2, that is, to the output terminal OUT of the amplifier and the bases are connected together to the input terminal IN of the amplifier. The emitter of Q5, which constitutes an output of the driver stage, is connected to the base of the npn transistor Q1 of the output stage and, by means of a constant-current generator G2, to the positive terminal of the supply, indicated vdd. The emitter of Q6, which constitutes a further output of the driver stage, is connected to the base of the pnp transistor Q2 of the output stage and to the collector of an npn transistor Q4, the emitter of which is connected to the negative supply terminal, indicated gnd.

The transistor Q4 constitutes the output branch of a current-mirror circuit, the input branch of which is formed by a diode-connected pnp transistor Q3 and having its emitter connected to the base of Q4 and to the positive supply terminal vdd by means of a constant-current generator G1.

The offset Vos of the amplifier will now be considered upon the assumption that both the npn transistors and the pnp transistors are identical to one another, and that the generators G1 and G2 generate an identical current I. By definition, if the voltages at the input IN and at the output OUT are indicated Vin and Vout, respectively, $$Vos = Vout - Vin$$

Clearly, the transistors Q3 and Q4 of the current mirror have identical base-emitter voltages $$Vbe(Q3) = Vbe(Q4)$$

If the base current of Q2 is ignored and it is borne in mind that the transistors Q6 and Q4 are two identical npn transistors through which the same current flows, $$Vbe(Q6) = Vbe(Q4)$$

If it is borne in mind that Q5 and Q3 are identical pnp transistors and that the currents supplied by the current generators G1 and G2 are identical, $$Vbe(Q5) = Vbe(Q3)$$

It can be deduced from the equations given above that the transistors Q5, Q6, Q3 and Q4 have the same base-emitter voltage Vbe.

It can also be seen that $$Vbe(Q1) + Vbe(Q2) = Vbe(Q5) + Vbe(Q6) \quad (1)$$

and that the following equation is true for the collector currents of the transistors Q5, Q6, Q1 and Q2, if their base currents are ignored, $$Ic(Q1) - Ic(Q2) = Ic(Q5) - Ic(Q6) \quad (2)$$

With the use of the known relationship which links the collector current of a transistor to its base-emitter voltage, equation (2) can be written $$Isn*exp(Vbe(Q1)/V_T) - Isp*exp(Vbe(Q2)/V_T) = Isn*exp(Vbe(Q5)/V_T) - Isp*exp(Vbe(Q6)/V_T) \quad (3)$$

where Isn and Isp are constants which describe the transfer characteristics of the npn and pnp transistors, respectively, in the active region, $V_T$ is the so-called thermal voltage and "exp" indicates that the expression which follows it is the exponent of the number e (the base of the natural logarithms).

It can be shown that the system of equations formed by equations (1) and (3) is solved upon the assumption that $$Vbe(Q1) = Vbe(Q6) \text{ and } Vbe(Q2) = Vbe(Q6)$$

from which $$Vbe(Q1) = Vbe(Q2)$$

With reference to the result obtained above regarding the equality of the base-emitter voltages of Q3, Q4, Q5 and Q6, it is concluded that the base-emitter voltages of all of the transistors of the circuit are equal. It is clear, therefore, that the offset of the amplifier is always zero:

$$Vos = Vout - Vin = Vbe(Q1) - Vbe(Q5) = 0$$

or $$Vos = Vout - Vin = Vbe(Q2) - Vbe(Q6) = 0$$

It is therefore clear that the operation of the amplifier is not affected by any variations of the base-emitter voltages with temperature and that different specimens of the amplifier, of which the transistors show differences in the base-emitter voltages because of the variability of the manufacturing parameters, have an identical response.

These results are achieved in the ideal conditions indicated above, that is, if the npn transistors, as well as the pnp transistors, are identical to one another, if the base currents of Q1 and Q2 are negligible, and if the currents of the generators G1 and G2 are identical. However, even significant deviations from these ideal conditions have little effect on the behaviour of the circuit. In fact, the offset is in any case always very low because it is equal to the difference between two Vbe values which, although they relate to transistors of different types, one npn and the other pnp, are very similar. For the same reason, the offset differences between different specimens of the same circuit are minimal. With regard to the variations of the offset due to temperature, these are also very limited, since their effects on the Vbe values of the npn transistors and of the pnp transistors are of opposite signs so that the variations tend to cancel one another out.

Figure 3:
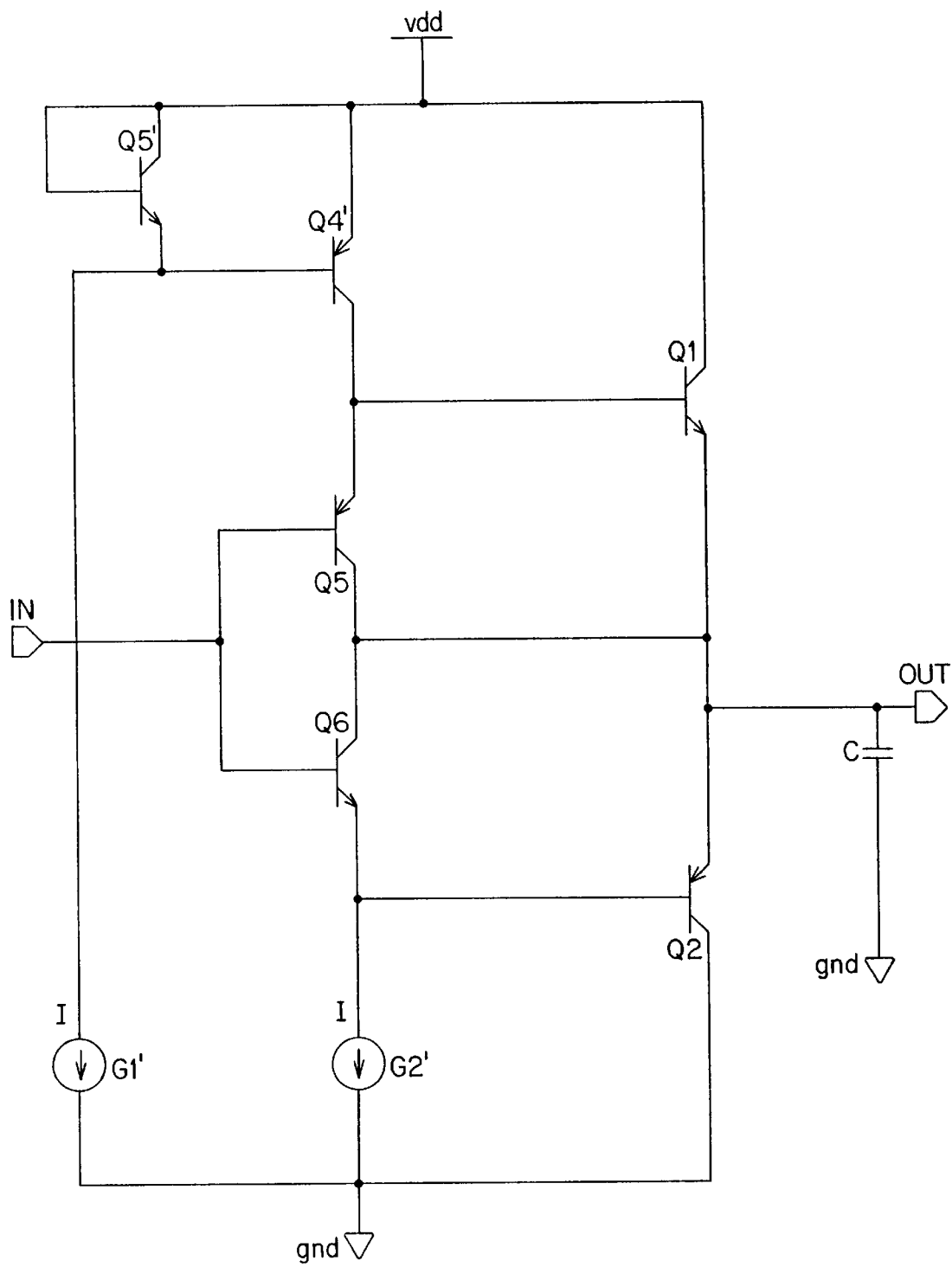
FIG. 3 shows a variant of the circuit of FIG. 2.

A variant of the circuit of FIG. 2 is shown in FIG. 3, in which the same components are indicated by the same reference symbols and equivalent components are indicated by the same symbols with the addition of a prime. As can be seen, the current-mirror circuit is constituted by transistors complementary to those of the circuit shown in FIG. 2 and is connected to the emitter of Q5 instead of the emitter of Q6.

According to another variant, not shown, n-channel and p-channel field-effect transistors are used instead of the npn and pnp bipolar transistors, respectively, their source, drain and gate terminals replacing the emitter, collector and base terminals, respectively. In this case, remarks wholly analogous to those given above can be made with regard to the threshold voltages of the n-channel or p-channel transistors instead of to the base-emitter voltages.

According to further variants, not shown, each transistor, whether of the bipolar or of the field-effect type, is replaced by a complementary transistor, the polarity of the supply being reversed in this case.

Although the invention has been described with reference to an amplifier for use as a buffer, particularly in high-frequency applications, it can clearly also be used advantageously in other fields of application, more precisely, in all those fields in which it is useful to have an amplifier with an offset which is as low as possible and independent of temperature.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier comprising a driver stage and an output stage connected in cascade between an input terminal and an output terminal of the amplifier, the output stage comprising a first npn transistor and a second pnp transistor, connected in a push-pull arrangement with one another, with their emitters connected together to the output terminal of the amplifier and with their collectors connected, respectively, to a first supply terminal and to a second supply terminal of the amplifier, which are intended to be connected, respectively, to the positive and negative poles of a supply, the driver stage having two output terminals connected, respectively to the base of the first transistor and to the base of the second transistor, wherein the driver stage comprises a current-mirror circuit having an input branch comprising a third pnp transistor connected in series with a first constant-current generator between the first and second supply terminals and an output branch comprising a fourth npn transistor, as well as a fifth pnp transistor and a sixth npn transistor with their collectors connected together to the output terminal of the amplifier and the bases connected together to the input terminal of the amplifier, the fifth transistor having its emitter connected to the first supply terminal by means of a second constant-current generator [the other has] and the sixth transistor having its emitter connected to the second supply terminal by means of the output branch of the current-mirror circuit, the emitters also being connected, respectively, to the base of the first transistor and to the base of the second transistor.

2. An amplifier according to claim 1, in which the first, fourth, and sixth npn transistors are substantially identical to one another, the second, third, and fifth pnp transistors are substantially identical to one another and the currents generated by the first and second constant-current generators are substantially identical.

3. An amplifier according to claim 1, in which n-channel field-effect transistors are provided instead of the npn transistors and p-channel field-effect transistors are provided instead of the pnp transistors, the emitters, collectors and bases of the npn and pnp transistors being replaced by the source, drain and gate electrodes of the n-channel and p-channel field-effect transistors, respectively.

4. An amplifier comprising a driver stage and an output stage coupled in cascade between an input terminal and an output terminal of the amplifier;

said output stage comprising a first control circuit element, comprising an npn transistor, having three terminals and a second control circuit element, comprising a pnp transistor, having three terminals, with first terminals of the first and second control circuit elements coupled together to the output terminal of the amplifier, and with second terminals of the first and second control circuit elements coupled across a voltage supply;

said driver stage having two output terminals coupled, respectfully, to the third terminals of the first and second control circuit elements; wherein said driver stage comprises;

a current-mirror circuit having an input branch comprising a third control circuit element comprising a pnp transistor having three terminals and an output branch comprising a fourth control circuit element comprising an npn transistor element having three terminals, a first constant current generator, a second constant current generator, a fifth control circuit element comprising a pnp transistor having three terminals, and a sixth control circuit element comprising an npn transistor having three terminals, wherein the first and second terminals of the third control circuit element are connected in series with the first constant current generator, the second terminals of the fifth and sixth control circuit elements are connected together to the output terminal of the amplifier, the first terminals of the fifth and sixth control circuit elements are connected, respectively, to the second constant current generator and to the second terminal of the fourth control circuit element, and the third terminals of the fifth and sixth control circuit elements are connected together to the input terminal of the amplifier.

5. An amplifier according to claim 4, wherein the first terminal of the fourth control circuit element couples to the voltage supply.

6. An amplifier according to claim 5 wherein the third terminal of the fourth control circuit element couples to the first terminal of the third control circuit element.

7. An amplifier according to claim 6 wherein the second and third terminals of the third control circuit element are connected together and to the voltage supply.

8. An amplifier according to claim 7 wherein the first terminals of the fifth and sixth control circuit elements are respectively coupled to the third terminals of the first and second control circuit elements.

9. An amplifier according to claim 4 wherein said first and second control circuit elements are connected in a push-pull arrangement with one another.

10. An amplifier according to claim 4 wherein said first, fourth and sixth control circuit elements are each npn transistors that are substantially identical to one another.

11. An amplifier according to claim 10 wherein said second, third and fifth control circuit elements comprise pnp transistors that are substantially identical to one another.

12. An amplifier according to claim 4 wherein the currents generated by the first and second constant-current generators are substantially identical.

13. An amplifier according to claim 4 wherein said first control circuit element comprises an n-channel field-effect transistor, said second control circuit element comprises a p-channel field-effect transistor, said third control circuit element comprises a p-channel field-effect transistor, said fourth control circuit element comprises an n-channel field-effect transistor, said fifth control circuit element comprises a p-channel field-effect transistor and said sixth control circuit element comprises an n-channel field-effect transistor.

14. An amplifier comprising:

a driver stage and an output stage connected in cascade so as to provide negligible offset, said driver stage and output stage coupled between an input terminal and output terminal of the amplifier:

said output stage including first npn transistor and second pnp transistor, means coupling the first and second transistors in a push-pull arrangement with one another and between first and second voltage supply lines, and means inter-coupling a common terminal of the first and second transistors to the output terminal of the amplifier;

said driver stage comprising, a current mirror circuit comprising an input branch including a third pnp transistor and an output branch including a fourth npn transistor a first constant current generator, a second constant current generator, a pair of drive transistors comprising a fifth pnp transistor and sixth npn transistor coupled in a push-pull configuration, means coupling the input terminal of the amplifier to like input terminals of the drive transistors, means coupling the current mirror circuit input branch in a first series branch with the first constant current generator, and means coupling in a second series branch the current mirror circuit output branch, the pair of drive transistors and the second constant current generator;

wherein said fifth pnp transistor is connected to the first voltage supply line by the second constant-generator and the sixth npn transistor is connected to the second voltage supply line by the current mirror circuit output branch.

15. An amplifier according to claim 14 wherein said first transistor comprises an npn transistor, said second transistor comprises a pnp transistor, and further wherein said first and sixth npn transistors are substantially identical and said second and fifth pnp transistors are substantially identical.

16. An amplifier comprising a driver stage and an output stage connected in cascade between an input terminal and an output terminal of the amplifier, the output stage comprising a first npn transistor and a second pnp transistor, connected in a push-pull arrangement with one another, with their emitters connected together to the output terminal of the amplifier and with their collectors connected, respectively, to a first supply terminal and to a second supply terminal of the amplifier, which are intended to be connected, respectively, to the positive and negative poles of a supply, the driver stage having two output terminals connected, respectively to the base of the first transistor and to the base of the second transistor, wherein the driver stage comprises a current-mirror circuit having an input branch comprising a third npn transistor connected in series with a first constant-current generator between the first and second supply terminals and an output branch comprising a fourth pnp transistor, as well as a fifth pnp transistor and a sixth npn transistor with their collectors connected together to the output terminal of the amplifier and the bases connected together to the input terminal of the amplifier, the sixth transistor having its emitter connected to the second supply terminal by means of a second constant-current generator and the fifth transistor having its emitter connected to the first supply terminal by means of the output branch of the current-mirror circuit, the emitters also being connected, respectively, to the base of the second transistor and to the base of the first transistor.

17. An amplifier according to claim 16, in which the first, third, and sixth npn transistors are substantially identical to one another, the second, fourth, and fifth pnp transistors are substantially identical to one another and the currents generated by the first and second constant-current generators are substantially identical.

18. An amplifier according to claim 16, in which n-channel field-effect transistors are provided instead of the npn transistors and p-channel field-effect transistors are provided instead of the pnp transistors, the emitters, collector and bases of the npn and pnp transistors being replaced by the source, drain and gate electrodes of the n-channel and p-channel field-effect transistors, respectively.

19. An amplifier comprising a driver stage and an output stage coupled in cascade between an input terminal and an output terminal of the amplifier;

said output stage comprising a first control circuit element, comprising an npn transistor, having three terminals and a second control circuit element, comprising a pnp transistor, having three terminals, with first terminals of the first and second control circuit elements coupled together to the output terminal of the amplifier, and with second terminals of the first and second control circuit elements coupled across a voltage supply;

said driver stage having two output terminals coupled, respectfully, to the third terminals of the first and second control circuit elements;

wherein said driver stage comprises;
a current-mirror circuit having an input branch comprising a third control circuit element comprising an npn transistor having three terminals and an output branch comprising a fourth control circuit comprising a pnp transistor element having three terminals,
a first constant current generator,
a second constant current generator,
a fifth control circuit element comprising a pnp transistor having three terminals,
and a sixth control circuit element comprising an npn transistor having three terminals, wherein the first and second terminals of the third control circuit element are connected in series with the first constant current generator, the second terminals of the fifth and sixth control circuit elements are connected together to the output terminal of the amplifier, the first terminals of the sixth and fifth control circuit elements are connected, respectively to the second constant current generator and to the second terminal of the fourth control circuit element, and the third terminals of the sixth and fifth control circuit elements are connected together to the input terminal of the amplifier.

20. An amplifier comprising:

a driver stage and an output stage connected in cascade so as to provide negligible offset, said driver stage and output stage coupled between an input terminal and output terminal of the amplifier:

said output stage including first npn transistor and second pnp transistor, means coupling the first and second transistors in a push-pull arrangement with one another and between first and second voltage supply lines, and means inter-coupling a common terminal of the first and second transistors to the output terminal of the amplifier;

said driver stage comprising,
a current mirror circuit comprising an input branch including a third npn transistor and an output branch including a fourth pnp transistor
a first constant current generator,
a second constant current generator,
a pair of drive transistors comprising a fifth pnp transistor and sixth npn transistor coupled in a push-pull configuration,
means coupling the input terminal of the amplifier to like input terminals of the drive transistors,
means coupling the current mirror circuit input branch in a first series branch with the first constant current generator, and
means coupling in a second series branch the current mirror circuit output branch, the pair of drive transistors and the second constant current generator;

wherein said fifth pnp transistor is connected to the first voltage supply line by the current mirror circuit output branch and the sixth npn transistor is connected to the second voltage supply line by the second constant current generator.

* * * * *

UNITED STATES PATENT AND TRADEMARK OFFICE
CERTIFICATE OF CORRECTION

PATENT NO. : 5,963,065
DATED : October 5, 1999
INVENTOR(S) : Roberto Alini, Melchiorre Bruccoleri, Gaetano Cosentino and Valerio Pisati It is certified that error appears in the above-identified patent and that said Letters Patent is hereby corrected as shown below:

On the title page, Item [30] should read as follows:

[30]     Foreign Application Priority Data
January 26, 1996  [EP]  European Pat. Off.   96830035.0

Signed and Sealed this

Second Day of May, 2000

*Attest:*

Q. TODD DICKINSON

*Attesting Officer*        *Director of Patents and Trademarks*